(12) United States Patent
Boe

(10) Patent No.: US 6,178,611 B1
(45) Date of Patent: *Jan. 30, 2001

(54) APPARATUS FOR INSTALLING A CLIP

(75) Inventor: Craig L. Boe, Nampa, ID (US)

(73) Assignee: Micron Electronics, Inc., Nampa, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/976,142

(22) Filed: Nov. 21, 1997

(51) Int. Cl.⁷ ........................................ B23P 11/00
(52) U.S. Cl. .................. 29/243.56; 29/243.35; 29/278; 29/270
(58) Field of Search .............. 24/562, 456, 458, 24/464, 459, 545; 29/450, 451, 525.01, 270, 225, 235, 243.56, 278; 439/331; 361/704, 697

(56) References Cited

U.S. PATENT DOCUMENTS

| | | | |
|---|---|---|---|
| 184,599 | * 11/1876 | Ehrhardt | 29/270 |
| 366,436 | * 7/1887 | Sylvester | 29/270 |
| 439,994 | * 11/1890 | Ballard . | |
| 514,799 | * 2/1894 | Wildt | 29/270 |
| 585,423 | * 6/1897 | Bogle . | |
| 590,094 | * 9/1897 | Duncan . | |
| 887,979 | * 5/1908 | Stockwell . | |
| 1,256,426 | * 2/1918 | Baltzley . | |
| 1,557,370 | * 10/1925 | Lane . | |
| 2,166,089 | * 7/1939 | Brenner | 29/270 |
| 2,175,626 | * 10/1939 | Butler | 29/270 |
| 2,438,174 | * 3/1948 | Laing . | |
| 2,566,454 | * 9/1951 | Laschke . | |
| 2,616,142 | * 11/1952 | Tinnerman . | |
| 2,676,377 | * 4/1954 | Garcia . | |

(List continued on next page.)

FOREIGN PATENT DOCUMENTS

| | | | | |
|---|---|---|---|---|
| 1004188 | * | 3/1952 | (FR) | 29/229 |
| 123664 | * | 3/1919 | (GB) | 29/229 |

OTHER PUBLICATIONS

IBM Technical Disclosure Bulletin, Frank and Hill, vol. 13, No. 7, Dec. 1970.*

IBM Technical Disclosure Bulletin, Bocinski, Forster, and Petrozellol, vol. 20, No. 3. Aug. 1977.*

*Primary Examiner*—I Cuda Rosenbaum
*Assistant Examiner*—Steve Blount
(74) *Attorney, Agent, or Firm*—Perkins Coie LLP

(57) ABSTRACT

An apparatus for installing and removing a retaining clip. The retaining clip has first and second spaced apart and opposing securing members and each securing member is connected to and movable relative to an intermediate member. The apparatus comprises a first engaging member having an engaging portion sized and shaped to releasably engage a tab portion of the first securing member and a second engaging member having an engaging portion sized and shaped to releasably engage a tab portion of the second securing member. The engaging portions of the first and second engaging members are movable toward and away from each other. A guide structure is coupled to the first and second engaging members to allow at least one of the engaging members to move along a motion path toward and away from the other of the first and second engaging members. The apparatus may accordingly be used to spread apart the securing members of the clip, engage the clip with a pair of components, and release the clip so as to couple the components together.

13 Claims, 5 Drawing Sheets

U.S. PATENT DOCUMENTS

| | | | |
|---|---|---|---|
| 2,685,679 | * | 8/1954 | Sam . |
| 2,887,110 | * | 5/1959 | Roeschmann . |
| 3,254,649 | * | 6/1966 | Wood .................................. 29/270 |
| 3,420,029 | * | 1/1969 | Martin . |
| 3,446,212 | * | 5/1969 | Le Roy . |
| 3,579,795 | * | 5/1971 | Burman . |
| 3,699,629 | * | 10/1972 | Hood, Jr. et al. ...................... 29/270 |
| 3,974,556 | * | 8/1976 | Kubik .................................. 29/270 |
| 4,012,097 | * | 3/1977 | Long et al. .......................... 439/350 |
| 4,100,717 | * | 7/1978 | Kontinen .............................. 29/235 |
| 4,215,468 | * | 8/1980 | Greco .................................. 29/764 |
| 4,244,090 | * | 1/1981 | Foret, Sr. ............................. 29/235 |
| 4,323,378 | * | 4/1982 | Miljoen . |
| 4,504,105 | * | 3/1985 | Barkus et al. ........................ 439/331 |
| 4,619,343 | * | 10/1986 | Lengenfelder ....................... 181/208 |
| 4,689,865 | * | 9/1987 | Chamblee ............................ 29/229 |
| 4,858,309 | * | 8/1989 | Korsunsky et al. ................... 29/764 |
| 4,872,251 | * | 10/1989 | Sheppard .......................... 29/243.56 |
| 5,212,859 | * | 5/1993 | Hagerty ................................ 29/229 |
| 5,226,634 | * | 7/1993 | Rudy, Jr. et al. .................... 267/181 |
| 5,241,453 | * | 8/1993 | Bright et al. ......................... 361/704 |
| 5,276,585 | * | 1/1994 | Smithers .............................. 361/704 |
| 5,396,402 | * | 3/1995 | Perugini et al. ..................... 361/704 |
| 5,486,981 | * | 1/1996 | Blomquist ............................. 24/625 |
| 5,495,392 | * | 2/1996 | Shen .................................... 361/697 |
| 5,536,874 | * | 7/1996 | White ................................ 29/426.6 |
| 5,594,624 | * | 1/1997 | Clemens et al. ..................... 361/704 |
| 5,671,118 | * | 9/1997 | Blomquist ............................ 361/704 |
| 5,734,556 | * | 3/1998 | Saneinejad et al. ................. 361/719 |
| 5,771,155 | * | 6/1998 | Cook ................................... 361/710 |
| 5,771,960 | * | 6/1998 | Lin ...................................... 361/704 |
| 5,784,257 | * | 7/1998 | Tata ..................................... 361/704 |
| 5,791,403 | * | 8/1998 | Chiou .................................. 361/704 |
| 5,801,929 | * | 9/1998 | Cheng .................................. 361/807 |

* cited by examiner

APPARATUS FOR INSTALLING A CLIP

TECHNICAL FIELD

The present invention is directed toward an apparatus for installing and removing a mechanical clip, and more specifically for installing and removing a clip having two opposing securing members connected to an intermediate member.

BACKGROUND OF THE INVENTION

Heat sinks are used to dissipate heat from CPUs, memory devices and other electronic components. One conventional method for attaching the heat sink to an electronic component is to use RIV screws or other self-tapping screws. The screws are installed and removed using an Allen wrench in a conventional manner. One difficulty with RIV screws and similar attachment means is that the wrenches used to install and remove the screws may be difficult to maneuver, particular near the heat sink fins. As a result, the user may lose control of the screws and/or the wrench while installing or removing the screws. The screws may be difficult to retrieve from between the fins of the heat sink, or may become lodged in the electronic component, potentially damaging the component if they are not removed.

One method for avoiding the above drawbacks is to removably clip the heat sink to the electronic component with a unitary heat sink clip. The clip includes two opposing securing members which engage the component and which are connected to an intermediate member. The clip clamps the heat sink and the component between the intermediate member and the securing members. One drawback of the unitary heat sink clip is the difficulty in installing and removing it. To install the clip, a user must generally simultaneously manipulate two screw drivers to spread apart the securing members of the clip prior to attaching the clip. Then, while holding the clip in a spread-apart position, the user may be required to exert considerable downward force to engage the clip with the heat sink and the component to which the heat sink is attached. The user may lose control of one or both of the screwdrivers during either of the above steps, making installation of the clip difficult. Furthermore, if the user loses control of the screwdrivers while exerting a downward force on the clip, he may cause the screwdrivers to slip and damage either the heat sink or the component to which the heat sink is attached. Screwdrivers must often be manipulated in a similar manner to remove the clip if it becomes necessary to do so after installation.

SUMMARY OF THE INVENTION

The present invention is an apparatus for installing and removing a retaining clip. The retaining clip has first and second spaced apart and opposing securing members. Each securing member is connected to and movable relative to an intermediate member. In one embodiment, each securing member also has a tab portion projecting away therefrom and the tool comprises a first engaging member having an engaging portion with a first aperture therein sized and shaped to releasably engage the tab portion of the first securing member. The tool further comprises a second engaging member having an engaging portion with a second aperture therein sized and shaped to releasably engage the tab portion of the second securing member. A guide structure is coupled to the first and second engaging members and allows the engaging portion of at least one of the engaging members to move along a motion path toward and away from the engaging portion of the other of the engaging members.

In one embodiment, the guide structure comprises a pivot member positioned intermediate the first and second engaging members. The first engaging member is pivotable about a first axis relative to the pivot member and the second engaging member is pivotable about second axis relative to the pivot member which is different than the first axis.

In another embodiment, the first engaging member is pivotally connected to the second engaging member. Each engaging member is elongated and has a handle portion at one end adapted to be engaged by a user's hand and an engaging portion at an opposite end adapted to engage one of the securing members of the retaining clip.

In yet a further embodiment, the guide structure comprises at least one guide member. At least one of the first and second engaging members is slidable toward and away from the other of the first and second engaging members along the guide member. The first and second engaging members may be biased away from each other or the tool may further comprise a driving member which extends between the engaging members to move at least one of the engaging members toward and away from the other engaging member.

DETAILED DESCRIPTION OF THE INVENTION

The present invention is directed toward a tool for installing and removing a mechanical clip having spaced apart securing members connected to an intermediate member. The tool may be used to spread apart or bring together the securing members of the clip while at the same time maintaining control of the clip. The tool may also be used to elastically deform the clip slightly as it is installed, to ensure that the clip tightly fastens two components together. FIGS. 1–8 illustrate various embodiments of the apparatus and methods, and like reference numbers refer to like parts throughout the Figures.

Figure 1:
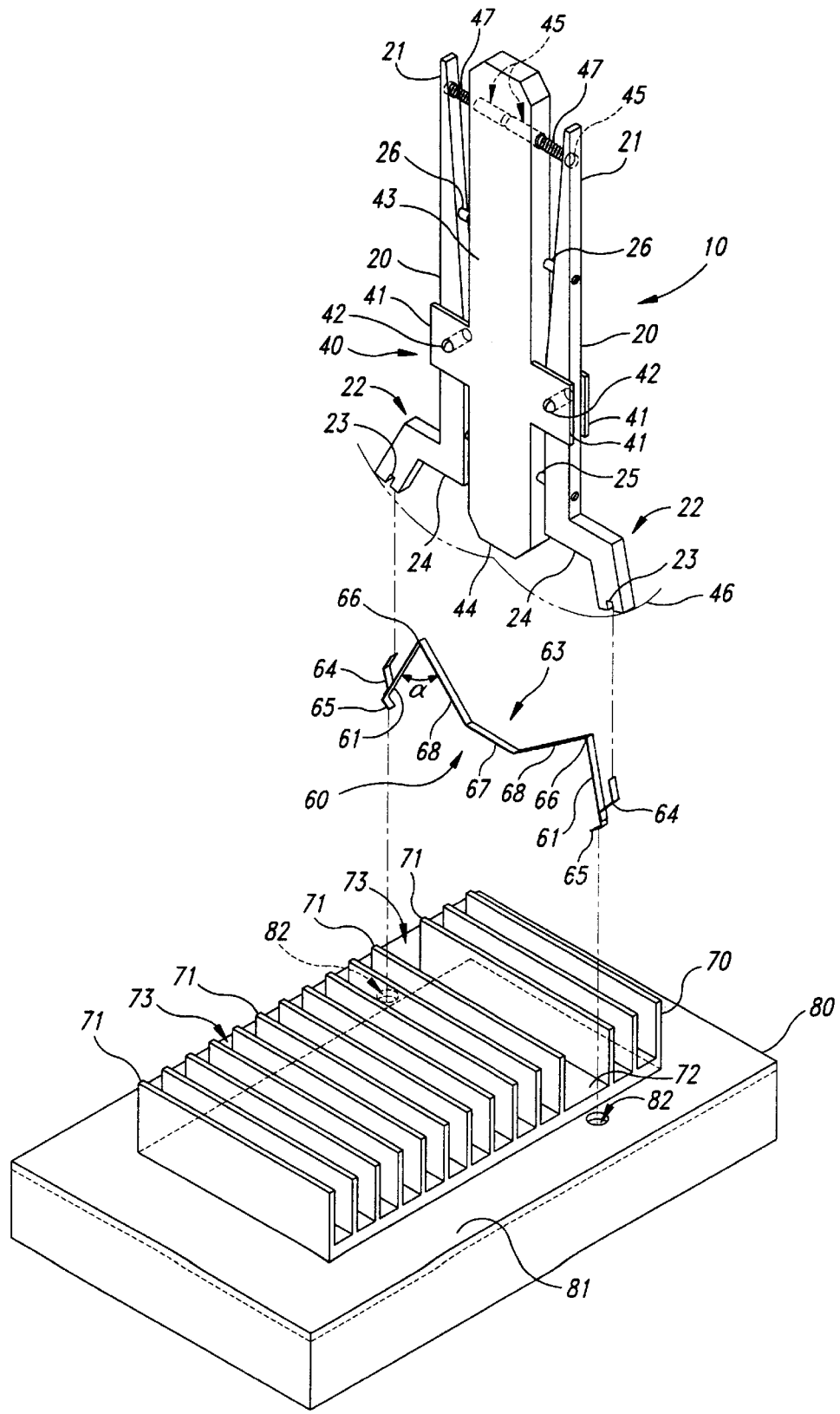
FIG. 1 is an isometric view of a tool in accordance with a first embodiment of the present invention positioned to connect a retaining clip to first and second components.

FIG. 1 is an exploded isometric view of a tool 10 in accordance with an embodiment of the invention, positioned to releasably engage a retaining clip 60. Once the tool 10 has engaged the retaining clip 60, it is used to position the clip against a first component 70, which may be a heat sink. The clip is then partially inserted into apertures of a second component 80, such as a chassis, and released so as to fasten the first component 70 to the second component 80.

As shown in FIG. 1, the first component 70 may comprise a heat sink having a base 72 and fins 71 projecting upwardly from the base. The fins are spaced apart and separated by gaps 73. The first component 70 is positioned on an upper surface 81 of the second component 80. The upper surface 81 has mounting apertures 82 located proximate the first component 70 and sized to releasably receive the retaining clip 60. The retaining clip 60 accordingly fits between the fins 71 of the first component 70, extends into the apertures 82 of the second component 80 and clamps the first component to the upper surface 81 of the second component.

The retaining clip 60 has two spaced apart securing members 61 which may be aligned with the mounting apertures 82. The securing members 61 are connected to an intermediate member 63 at connection portions 66. An angle α between each securing member 61 and the intermediate member 63 may be acute in one embodiment and may be obtuse in alternate embodiments. In a referred embodiment, the securing members 61 and intermediate members 63 are integrally formed from a resilient, springy material such as stainless steel. Accordingly, when the securing members 61 are elastically bent away from the intermediate member 63 at the connection portions 66, they tend to return to their original positions.

The intermediate member 63 includes a flat portion 67 which is adapted to engage the base 72 of the first component 70. The intermediate member 63 further includes two arms 68 which extend upwardly away from the flat portion 67. The arms 68 are connected to the securing members 61 at the connection portions 66.

The securing members 61 include projections 65 which extend inwardly toward the intermediate member 63 to engage the second component 80 as will be discussed in greater detail below. The securing members 61 further include tabs 64 which extend outwardly away from the intermediate member 63 and are positioned to be engaged by the tool 10.

The tool 10 includes a pair of engaging members 20 coupled to each other by a guide sructure 40. The engaging members 20 are configured to releasably engage the securing members 61 of the retaining clip 60. The guide structure 40 permits the engaging members 20 to be moved toward and away from each other along a motion path 46 extending between and beyond the engaging members and shown schematically as a dashed line in FIG. 1.

In a preferred embodiment, each engaging member 20 is elongated and includes a handle portion 21 at one end and an engaging portion 22 at an opposite end. Each handle portion 21 is adapted to be engaged by a user's hand or fingers (not shown). The two handle portions 21 are spaced apart, but remain sufficiently close together that the user may easily engage both handle portions simultaneously with one hand.

Each engaging portion 22 preferably includes a tab slot 23 sized and shaped to releasably engage the tabs 64 of the retaining clip 60. In a preferred embodiment, the engaging portions 22 are sized and shaped to fit snugly between the tabs 64 and the securing member 61 when the tab slots 23 receive the tabs. Accordingly, the tabs 64 of the retaining clip 60 are less likely to slip out of engagement with the tab slots 23. In an alternate embodiment wherein the securing members 61 do not include tabs 64, the engaging portions 22 may releasably engage the securing members directly. In one such alternate embodiment, each engaging portion 22 may include a closed or partially closed ring which extends away therefrom and which is sized and shaped to removably receive one of the securing members 61.

In a preferred embodiment, each engaging portion 22 further includes a bearing surface 24 positioned to engage the connection portions 66 of the retaining clip 60 when the tab slots 23 engage the tabs 64. In a preferred method of operation, the bearing surfaces 24 of the engaging members 20 bear against the connection portions 66 of the retaining clip 60 when the tab slots 23 engage the tabs 64 to more evenly distribute the load placed on the retaining clip. In an alternate method of operation, the tool 10 engages the tabs 64 but not the connection portions 66 of the retaining clip, as will be discussed in greater detail with reference to FIG. 5. Where the tool 10 is to be used to engage the retaining clip 60 with a heat sink, the engaging portions 22 are preferably narrow enough to fit within one of the gaps 73 between the heat sink fins 71.

In a preferred embodiment, the engaging members 20 are pivotally connected to the guide structure 40. Accordingly, the guide structure 40 includes a pivot member 43 positioned between the two engaging members 20. The pivot member 43 includes two pairs of spaced apart flanges 41 extending outwardly away from the pivot member in opposite directions. Each engaging member 20 fits between a pair of flanges 41 and is pivotally attached to the flanges with a pivot pin 42. Accordingly, the same ends of the engaging members 20 may pivot toward and away from each other on the pivot pins 42 so that the engaging portions 22 move along the motion path 46.

The extent of the mction of the engaging portions 22 along the motion path 46 may be controlled by upper stops 26 and lower stops 25. The upper stops 26 may be positioned to engage the pivot member 43 when the engaging portions 22 are at a first spaced apart position to prevent the engaging portions from spreading the securing members 61 too far apart from each other. The lower stops, 25 may be positioned to engage the pivot member 43 when the engaging portions 22 are at a second spaced apart, position to prevent the engaging portions from squeezing the securing members 61 too closely together. In one embodiment, the lower stops 25 may be adjusted such that they engage the pivot member 43 when the engaging portions 22 are aligned with the securing members 61 of the retaining clip 60. The lower stops 25 may accordingly help the user align the tool 10 with the retaining clip 60. Similarly, the upper stops 26 may be adjusted such that they engage the pivot member 43 when the engaging portions 22 have aligned the securing member 61 with the apertures 82 into which they fit. The upper stops 26 may accordingly help the user align the retaining clip 60 with the apertures 82. In a preferred embodiment, the, upper stops 26 and lower stops 25 comprise set screws which may be easily adjusted with a screwdriver to limit the travel of the engaging portions 22.

The pivot member 43 includes springs 47 positioned between the pivot member and the engaging members 20 to bias the engaging members away from the pivot member. The ends of each spring 47 are housed in spring apertures 45 formed in both the pivot member 43 and the engaging member 20. The pivot member further includes a flattened end surface 44 sized and shaped to engage the flat portion 67 of the retaining clip 60. The end surface 44 provides a stop surface to prevent the securing members 61 from bending excessively relative to the intermediate member 63 during installation, as is discussed below.

Figure 2:
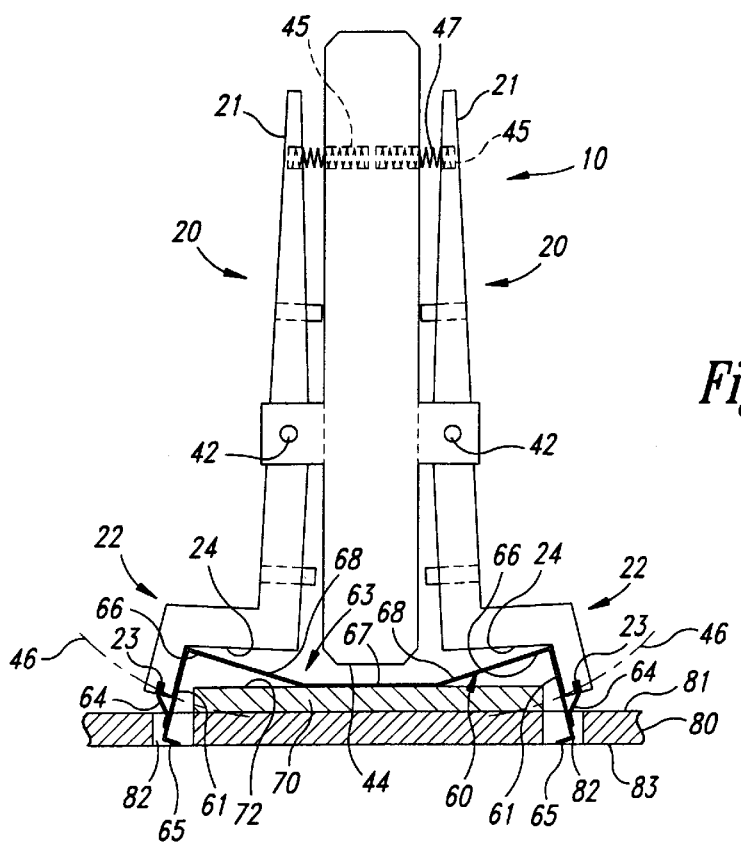
FIG. 2 is a front elevation view of the tool of FIG. 1 shown engaging the clip.

FIG. 2 is a front elevation view of the tool 10 of FIG. 1, shown engaging the retaining clip 60. Referring to FIGS. 1 and 2, the user preferably engages the tool 10 with the retaining clip 60 by inserting the tabs 64 of the securing members 61 into the tab slots 23 of the tool 10. The user then uses the tool 10 to place the retaining clip 60 in position over the first component 70 and second component 80. The user squeezes the handle portions 21 of the engaging members 20 toward the pivot member 43 to move the engaging portions 22 away from each other along the motion path 46 and move the securing members 61 apart from each other. The user continues to squeeze the handle portions 21 until the projections 65 are aligned with the mounting apertures 82.

Figure 3:
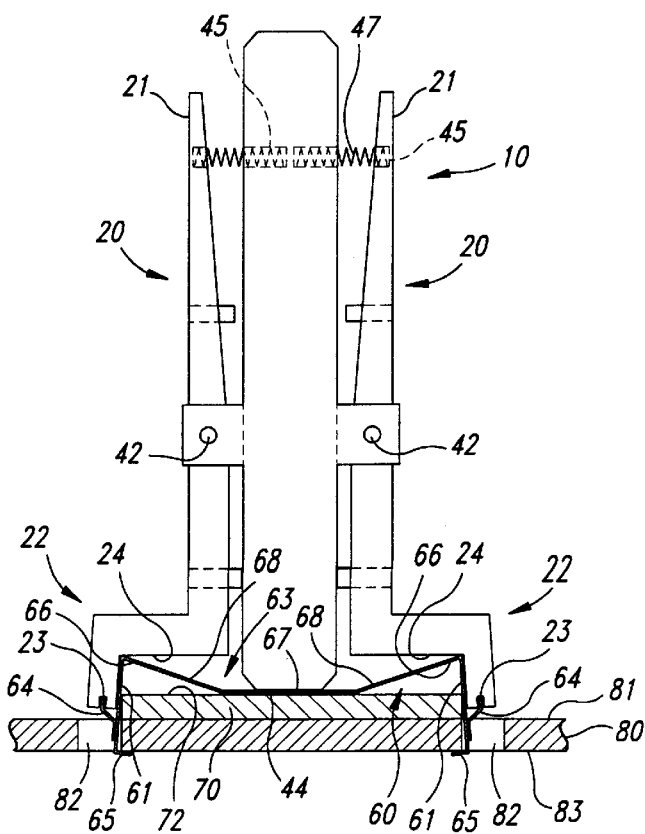
FIG. 3 is a front elevation view of the tool of FIG. 1 positioned to force securing members of the clip downwardly into apertures of the second component.

Once the retaining clip 60 has been aligned with the mounting apertures 82, the user lowers the tool 1 and retaining clip until the flat portion 67 of the retaining clip engages the base 72 of the first component 70, as shown in FIG. 2. The user then drives the securing members 61 downwardly into the mounting apertures 82, as shown in FIG. 3 The user applies a downward force on the tool 10 to elastically bend the securing members 61 slightly relative to the intermediate member 63 and/or elastically bend the arms 68 relative to the flat portion 67 of the intermediate member. The user continues to exert a downward force until the end surface 44 of the pivot member 43 engages the flat portion 67 of the retaining clip 60. At this point, the projections 65 at the ends of the securing members 61 are positioned below a lower surface 83 of the second component 80. The user relaxes his grip on the handle portions 21 of the engaging members 20, allowing the engaging-members to move toward each other along the motion path 46 under the force of the springs 47. The securing members 61 accordingly move toward each until they contact the walls of the mounting apertures 82. The user then draws the tool 10 upwardly away from the retaining clip 60 to disengage the tab 64 from the tab slots 23. The securing members 61 tend to spring back toward the intermediate member 63 until the projections 65 engage the lower surface 83 of the second component 80. The retaining clip 60 accordingly clamps the first and second components 70 and 80 between the projections 65 and the intermediate portion 63 of the retaining clip. To remove the retaining clip 60 from the mounting apertures 82, the user reverses the foregoing steps.

One advantage of the tool 10 shown in FIGS. 1–3 is that the tool may allow the user to engage the retaining clip 60, spread apart the securing members 61 of the clip, and fasten the clip in position, all with one hand. This is advantageous because it may free the user's remaining hand for other tasks, such as maintaining the position between the first and second components 70 and 80 as the components are clipped together.

Another advantage is that tool 10 shown in FIGS. 1–3 may allow the user to maintain control of the retaining clip 60 as he or she engages the retaining clip with the first and second components 70 and 80. Unlike conventional methods, in which the use may use two screwdrivers to spread the securing members 61 of the retaining clip 60, the tool 10 shown in FIGS. 1–3 may positively engage the retaining clip The tool 10 may accordingly reduce the likelihood that the tool or the retaining clip 60 will slip during installation and damage the components to which the retaining clip is attached.

Yet another advantage of the tool 10 shown in FIGS. 1–3 is that the engaging members 20 of the tool may engage both the tabs 64 and the connection portions 66 of the retaining clip 60, when the securing members 61 are forced into the apertures 82 of the second component 80. Because the tool 10 may engage the connection portions 66 as well as the tabs 64, the downward load imposed on the retaining clip 60 may be more evenly distributed, reducing the likelihood that the tabs will break as the retaining clip is installed. A further advantage is that the engaging portions 22 fit snugly between the tabs 64 and the securing members 61. Accordingly, the likelihood that the retaining clip 60 will inadvertently slip out of engagement with the tool 10 is reduced.

Yet a further advantage of the tool 10 shown in FIGS. 1–3 is that the end surface 44 of the pivot member 43 may be spaced apart from the intermediate member 63 of the retaining clip 60 by a selected distance when the tool initially engages the retaining clip. Accordingly, when the user forces the securing members 61 downwardly into the mounting apertures 82, the downward motion is stopped when the end surface 44 engages the intermediate member 63. The end surface 44 may thus advantageously prevent the securing members 61 from being forced so far into the apertures 82 that they either break away from the intermediate member 63 or are stretched beyond their elastic limits and fail to clamp the first and second components 70 and 80 together.

Still a further advantage of the tool 10 shown in FIGS. 1–3 is that the axes on which the engaging members 20 pivot are spaced apart in a lateral direction. Accordingly, the motion of the engaging portions 22 along the motion path 46 is approximately horizontal near the securing members 61. Because the engaging portions 22 spread the securing members 61 apart in a nearly horizontal path, the tab slots 23 may maintain engagement with the tabs 64 and not tend to move in a vertical direction, which might cause the tab slots to pull away from the tabs.

Figure 4:
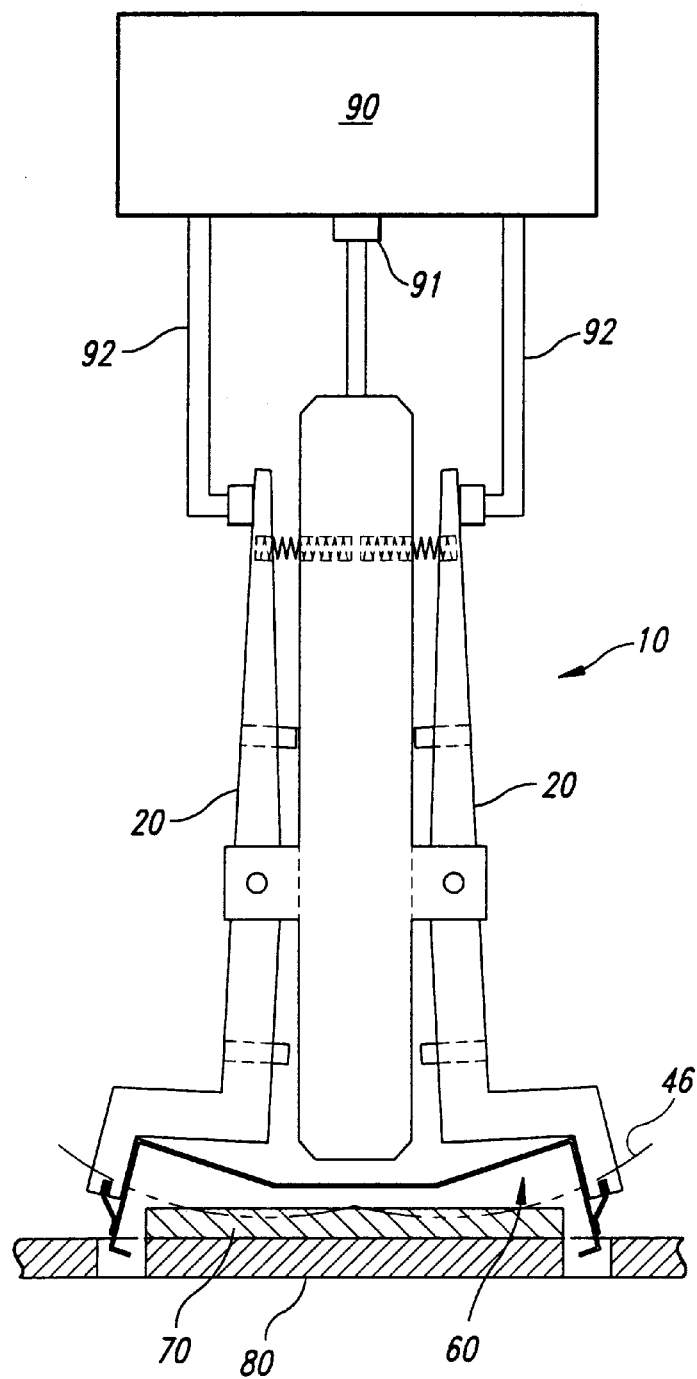
FIG. 4 is a front elevation view of an automated tool in accordance with a second embodiment of the invention engaging a retaining clip.

FIG. 4 is a front elevation view of an automated tool 10 in accordance with a second embodiment of the invention. The tool 10 is operatively coupled to an actuator 90 which automatically operates the tool in a manner similar to that described previously with reference to FIGS. 1–3. In a preferred embodiment, the actuator 90 includes actuator arms 92 which are coupled to the engaging members 20 of the tool 10 and drive the engaging members toward and away from each other along the motion path 46. The actuator 90 further includes an actuator piston 91 which raises and lowers the tool 10 relative to the first and second components 70 and 80. In a preferred embodiment, the entire actuator 90 is movable relative to the first and second components 70 and 80 toward and away from a bin (not shown), which contains a plurality of retaining clips 60. Accordingly, the actuator 90 and the tool 10 may be used to automatically retrieve retaining clips 60 from the bin and attach them to the first and second components 70 and 80 in a manner substantially as described previously with reference to FIGS. 1–3.

In the embodiment shown n FIG. 4, the actuator 90 is coupled to a tool 10 which is substantially the same in overall appearance and operational characteristics to the tool shown in FIGS. 1–3. In alternate embodiments, tools 10 according to any of the embodiments shown in FIGS. 5–8 may be automated in a similar manner. In still further alternate embodiments, the actuator 90 may include means other than the piston 91 and arms 92 which similarly automate operation of the tool 10.

An advantage of the tool 10 shown in FIG. 4 is that the tool may be used to automate the process of coupling the first component 70 to the second component 80. The automated process may reduce the time and manpower required to assemble the first and second components and may also improve the accuracy with which the components are coupled.

Figure 5:
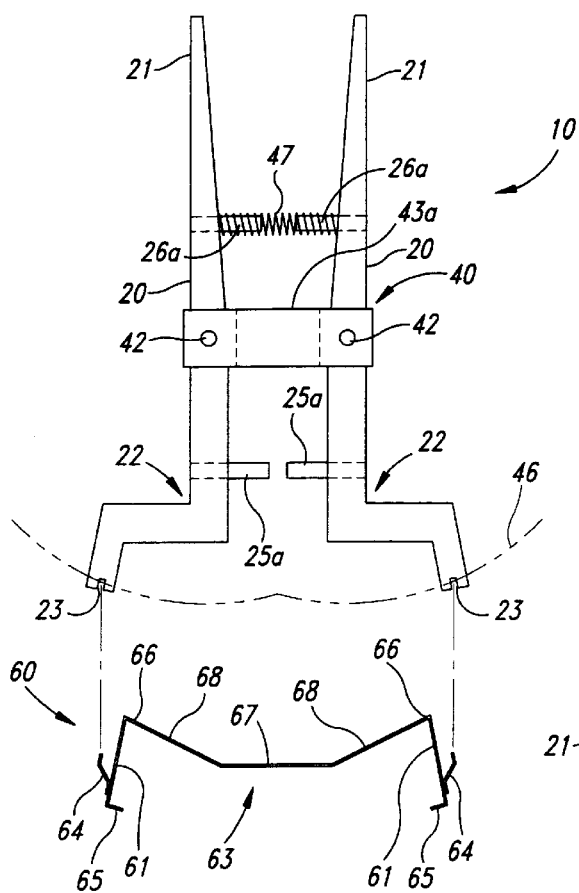
FIG. 5 is a front elevation view of a tool in accordance with a third embodiment of the invention and a retaining clip.

FIG. 5 is a front elevation view of a tool 10 in accordance with a third embodiment of the invention. The tool 10 includes a guide structure 40 comprising a pivot member 43a which extends only a short distance in the vertical direction between the engaging members 20. Accordingly, the pivot member 43a does not engage the intermediate member 63 of the retaining clip 60 when the tool 10 is used to install the retaining clip.

The upper stops 26a are extended in a lateral direction when compared with the upper stops 26 shown in FIGS. 1–3 so as to engage each other rather than the pivot member 43a. The lower stops 25a are similarly extended in the lateral direction to engage each other. The spring 47 extends between the upper stops 26a to bias he engagement portions 22 toward each other. Operation of the tool 10 shown in FIG. 5 is substantially similar to operation of the tool discussed previously with reference to FIGS. 1–3, except that the pivot member 43a will not engage the intermediate member 63 to prevent the securing members 61 from being inserted too deeply into the apertures 82 of the second component 80.

An advantage of the tool 10 shown in FIGS. 5 when compared to the tool shown in FIGS. 1–3 is that the pivot member 43a has a reduced size and the tool may accordingly be lighter, cheaper to manufacture, and easier to handle. A further advantage is that the smaller pivot member 43a may allow the user greater visibility of the retaining clip while installing or removing the retaining clip. Conversely, an advantage of the tool 10 shown in FIGS. 1–3 is that the larger pivot member 43a may engage the intermediate member 63 when the tool is used to insert the retaining clip, preventing the user from overextending the securing members 61, as discussed previously.

Figure 6:
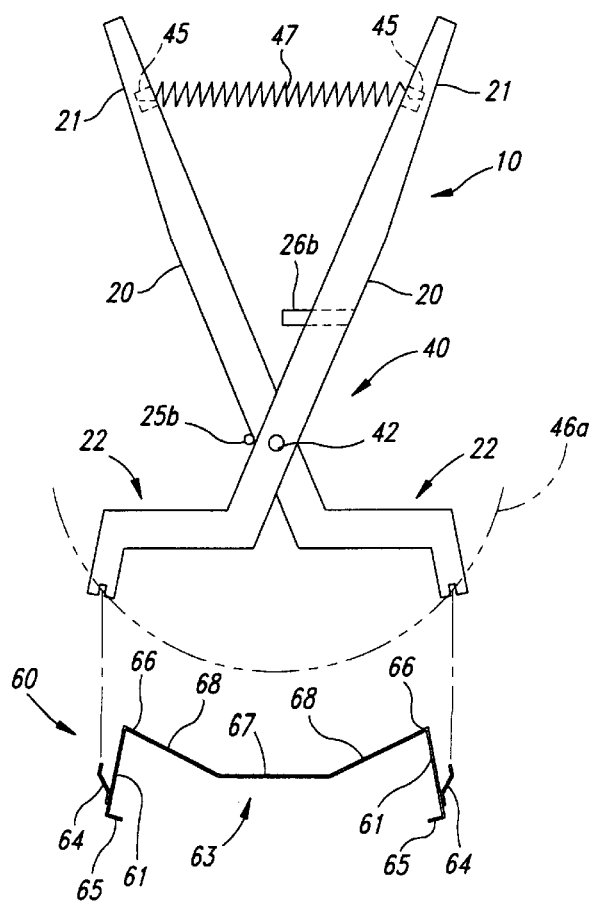
FIG. 6 is a front elevation view of a tool in accordance with a fourth embodiment of the invention having pivotally connected engaging members positioned to engage a retaining clip.

FIG. 6 is a front elevation view of a tool 10 in accordance with a fourth embodiment of the invention. The tool 10 includes a guide structure 40 which does not have a pivot member positioned between the engaging members. Instead, the guide structure 40 comprises a pivot pin 42 pivotally coupling the engaging members 20 directly to each other. The engaging members 20 are accordingly pivotable relative to each other along the motion path 46a. The upper stops 26b and lower stops 25b are positioned to prevent over-expansion and over-compression, respectively, of the retaining clips 60 which the tool 10 engages. The tool 10 further includes a spring 47 positioned between the engaging members 20 to bias the engaging members apart. Operation of the tool shown in FIG. 6 is substantially the same as operation of the tool discussed previously with reference to FIGS. 1–3.

An advantage of the tool 10 shown in FIG. 6 when compared to the tool shown in FIGS. 1–3 is that by eliminating the pivot member, the tool may be cheaper and easier to manufacturer. Conversely, an advantage of the tool shown in FIGS. 1–3 is that the motion path 46 is nearly horizontal where the engaging members 20 are proximate the securing members 61, whereas the motion path 46a shown in FIG. 6 tends to include a vertical component as a result of the position of the engaging portions 22 relative to the pivot pin 42. Accordingly, the engaging portions 22 of the tool shown in FIGS. 1–3 may have a reduced tendency to move vertically disengage the tabs 64 from the tab slots 23 as the engaging portions 22 are moved apart from each other.

Figure 7:
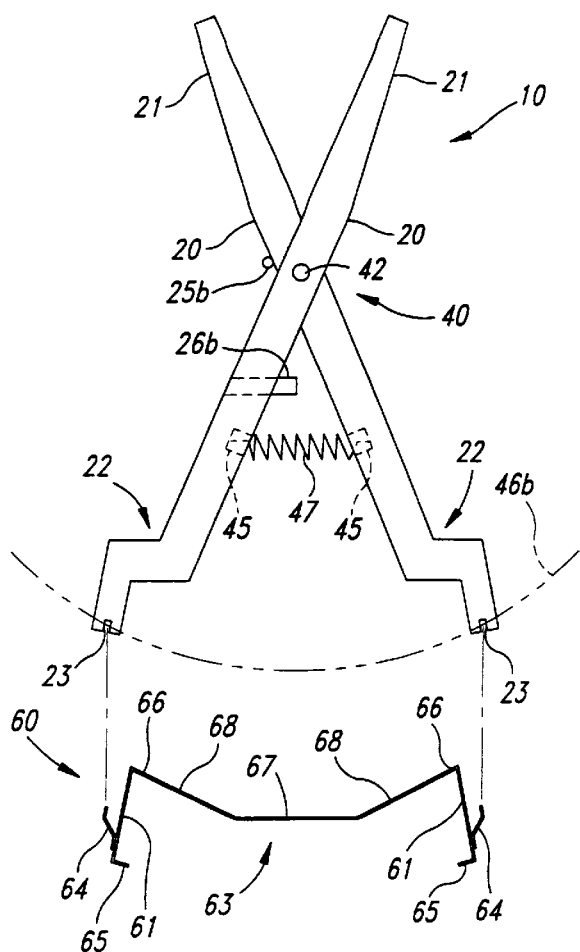
FIG. 7 is a front elevation view of a tool in accordance with a fifth embodiment of the invention and a retaining clip.

FIG. 7 is a front elevation view of a tool 10 in accordance with a fifth embodiment of the invention having a pivot pin 42 placed further from the engaging portions 22 than is the pivot in shown in FIG. 6. As a result, the motion path 46b along which the engaging portions 22 travel has a smaller vertical component near the securing members 61 of the retaining clip 60 than does the motion path 46a shown in FIG. 6. The positions of the upper and lower steps 26b and 25b are reversed when compared to the positions of these components shown in FIG. 6 to account for the change in location of the pivot pin 42.

An advantage of the tool 10 shown in FIG. 7 is that the engaging portions 22 tend to move in a substantially horizontal direction near the securing members 61 and are therefore less likely to cause the tabs 64 to disengage from the tab slots 27. Conversely, an advantage of the tool shown in FIG. 6, when compared to the tool shown in FIG. 7 is that the handle portions 21 of the tool shown in FIG. 6 are further from the in 42 than are the handle portions shown in FIG. 7. Accordingly, the mechanical advantage provided by the engaging members 20 shown in FIG. 6 may be greater than the mechanical advantage provided by the engaging members shown in FIG. 7, and the user may more easily move the securing members 61 apart from each other.

Figure 8:
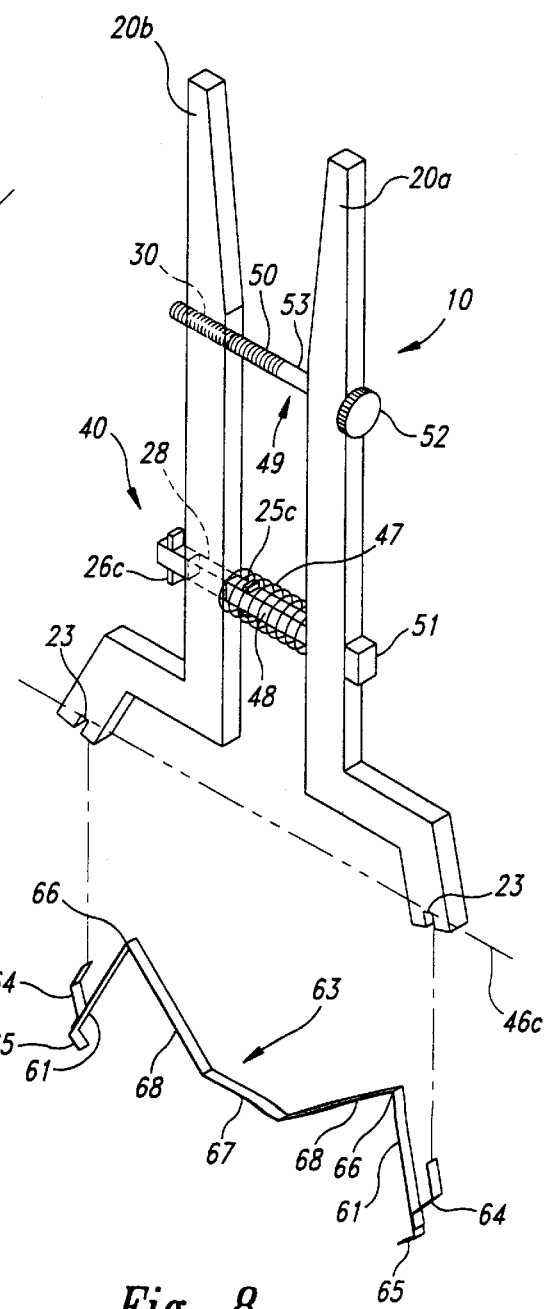
FIG. 8 is an isometric view of a tool in accordance with a sixth embodiment of the invention having translatable engaging members positioned to engage a retaining clip.

FIG. 8 is an explode isometric view of a tool 10 having translatable engaging members in accordance with a sixth embodiment of the invention. The tool 10 includes first and second spaced apart engaging members 20a and 20b coupled to the guide structure 40. The guide structure 40 includes a guide rod 48 which has a head 51 at one fixedly attached to the first engaging member 20a. The guide rod 48 has an opposite end slidably extending through a guide rod aperture 28 positioned n the second engaging member 20b. Accordingly, the second engaging member 20b may slide along the guide rod 48 and along the motion path 46c toward and away from the first engaging member 20a. An inner stop 25c and outer stop 26c positioned on the guide rod 48 prevent over-compression and over-expansion, respectively, of the retaining clip 60 when the tool 10 engages the retaining clip.

In a preferred embodiment the guide rod 48 and guide rod aperture 28 have corresponding rectangular cross-sectional shapes. The first and second engaging members 20a and 20b are accordingly prevented from rotating relative to each other about the guide rod 48. In other embodiments, the guide rod 48 and guide rod aperture 28 may have other non-circular cross-sectional shapes which similarly prevent rotation of the engaging members 20a and 20b relative to each other. In still other embodiments, a plurality of guide rods 48 may extend between the engaging members 20a an 20b and through a plurality of guide rod apertures 28. The plurality of guide rods 48 will inherently prevent relative rotational motion between the first and second engaging members 20a and 20b and accordingly the guide rods and guide rod apertures 28 may have any cross-sectional shape.

In one embodiment, a spring 47 is positioned between the engaging members 20a and 20b to bias the engaging members apart from each other. The spring 47 has a spring constant large enough to spread apart the securing members 61 when the tool 10 engages the retaining clip 60 yet small enough to allow the user to squeeze the engaging embers 20a and 20b together.

In operation, the user may grasp the tool 10 in one hand by engaging the first engaging member 20a with his thumb and the second engaging member 20b with his fingers. The user then squeezes the first and second engaging members 20a and 20b together to align the tab slots 23 with the tabs 64 of the retaining clip 60. The user engages the tab slots 23 with the tabs 64 and slightly releases his grip on the engaging members 20*a* and 20*b* to allow the engaging members to move away from each other and spread the securing members 61 of the retaining clip 60. The user positions the retaining clip 60 over the first and second components 70 and 80 (FIGS. 1–3) and fully inserts the securing members 61 into the apertures 82 of the second component 80, substantially as described previously with reference to FIGS. 1–3. When the retaining clip 60 has been properly positioned, the user squeezes the engaging members 20*a* and 20*b* toward each other to release the tool 10 from the retaining clip 60.

In another embodiment of the tool 10, which is also shown in FIG. 8, a drive rod 49 may be used to supplement the biasing force supplied by the spring 47. The drive rod 49 includes a threaded portion 50 which threadably engages a threaded aperture 30 positioned in the second engaging member 20*b*. The drive rod 49 further includes an unthreaded portion 53 which slidably extends through a drive rod aperture 29 positioned in the first engaging member 20*a*. A drive rod knob or handle 52 is positioned proximate the unthreaded portion 53 and is sized and shaped to be engaged by the user's fingers.

Operation of an embodiment of the tool 10 which includes the drive rod 49 is substantially similar to the operation described above with reference to FIG. 8, except that the user may engage the drive rod handle 52 and rotate the drive rod 49 in a first direction to spread the first and second engaging members 20*a* and 20*b* apart, if the force provided by the spring 47 is insufficient to do so. When the tool 10 is removed from the retaining clip 60, the user may rotate the drive rod 49 in an opposite direction to draw the first and second engaging members 20*a* and 20*b* together.

An advantage of the tool 10 shown in FIG. 8 is that the motion path 46*c* may be horizontal to within the manufacturing tolerances of the guide rod 48 and the guide rod apertures 28. Accordingly, any tendency for the engaging portions 22 of the tool 10 to move in a vertical direction relative to the securing members 61 and potentially disengage the tab slots 23 from the tabs 64 of the retaining clip 60 is greatly reduced. A further advantage of an embodiment of the tool 10 shown in FIG. 8 is that the threaded drive rod 49 provides the user with a mechanical advantage for spreading apart the first and second engaging members 20*a* and 20*b* and therefore the securing members 61 of the retaining clip 60. The threads of the drive rod 49 may be selected to have a fine pitch so as to provide the user with a large mechanical advantage where the securing members 61 are difficult to spread apart. The threads of the drive rod 49 may have a coarse pitch, or the threaded rod may be eliminated entirely where a large mechanical advantage is not required.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A tool for installing and removing a retaining clip, the retaining clip having first and second spaced apart and opposing securing members, each securing member being connected to and movable relative to an intermediate member and having a tab portion projecting away therefrom, the tool comprising:

a first engaging member having a first engaging portion sized and shaped to releasably engage the first securing member, the first engaging portion having a first aperture therein facing away from the first engaging member and being sized and shaped to releasably engage the tab portion of the first securing member and a first handle portion having a first terminal end;

a second engaging member having a second engaging portion spaced apart form the first engaging portion and being sized and shaped to releasably engage the second securing member, the second engaging portion having a second aperture therein facing away from the second engaging member and being sized and shaped to releasably engage the tab portion of the second securing member and a second handle portion having a second terminal end, wherein the first and second terminal ends of the said first and second handle portions are movable towards and away from each other; and a guide structure coupled to the first and second engaging members and spaced apart from the engaging portions such that the first and second apertures face away from the guide structure and at least a portion of the first securing member of the retaining clip projects away from the first engaging member when the first securing member is engaged by the first engaging member, the guide structure allowing the engaging portion of at least one of the first and second engaging members to move along a motion path toward and away from the engaging portion of the other of the first and second engaging members between a first position with the engaging portions engaging the securing members and being spaced apart to install the retaining clip and a second position with the engaging portions engaging the securing members and being spaced apart to remove the retaining clip.

2. The tool of claim 1 wherein the guide structure includes at least one guide member, at least one of the first and second engaging members being slidable toward and away from the other of the first and second engaging members along the guide member.

3. The tool of claim 1 wherein the guide structure comprises a pivot member, at least one of the first and second engaging members being pivotable relative to the pivot member toward and away from the other of the first and second engaging members.

4. The tool of claim 1 wherein the guide structure comprises a pivot pin and at least one of the first and second engaging members is pivotable toward and away from the other of the first and second engaging members.

5. The tool of claim 1 wherein the first securing member is connected to the intermediate member at a connection portion and the engaging portion of the first engaging member is configured to engage the connection portion of the retaining clip.

6. The tool of claim 1, further comprising a stop engagable with at least one of the first and second engaging members to limit motion of the at least one of the first and second engaging members toward the other of the first and second engaging members.

7. The tool of claim 1, further comprising a stop engagable with at least one of the first and second engaging members to limit motion of the at least one of the first and second engaging members away from the other of the first and second engaging members.

8. The tool of claim 1, further comprising a biasing member operatively coupled to at least one of the first and second engaging members to bias at least one of the first and second engaging members away from the other of the first and second engaging members.

9. The tool of claim 1 wherein the first and second engaging members are elongated and extend away from the retaining clip when the engaging portions of the first and second engaging members engage the retaining clip, the first engaging member having a first handle portion spaced apart from the engaging portion thereof and the second engaging member having a second handle portion spaced apart from the engaging portion thereof.

10. The tool of claim 1, further comprising a powered actuator operatively coupled to at least one of the first and second engaging members to automatically move the at least one of the first and second engaging members along the motion path.

11. A tool for installing and removing a retaining clip, the retaining clip having first and second spaced apart and opposing securing members, each securing member being connected to and movable relative to an intermediate member and having a tab portion projecting away therefrom, the tool comprising:

a first engaging member having a first engaging portion sized and shaped to releasably engage the first receiving member, the first engaging portion having a first aperture therein facing away from the first engaging member and being sized and shaped to engage the tab portion of the first securing member and a first handle portion having a first terminal end;

a second engaging member spaced apart from the first engaging member having a second engaging portion sized and shaped to releasably engage the second securing member, the second engaging portion having a second aperture therein facing away from the second engaging member and being sized and shaped to receive the tab portion of the second securing member and a second handle portion having a second terminal end, wherein the first and second terminal ends of the said first and second handle portions are movable towards and away from each other;

a pivot member positioned intermediate the first and second engaging members such that the first aperture faces away from the pivot member and at least a portion of the first securing member of the retaining clip projects away from the first engaging member when the first securing member is engaged by the first engaging member, the first engaging member being pivotally connected to the pivot member and being pivotable about a first pivot axis relative to the pivot member, the second engaging member being pivotally connected to the pivot member and being pivotable about a second pivot axis relative to the pivot member, the second axis being spaced apart from the first pivot axis, the engaging portion of at least one of the first and second engaging members being pivotable toward and away from the engaging portion of the other of the first and second engaging members along a motion path extending between and beyond the engaging portions between a first position with the engaging portions engaging the securing members and being spaced apart to install the retaining clip and a second position with the engaging portions engaging the securing members and being spaced apart to remove the retaining clip.

12. The tool of claim 11 wherein the pivot member is positioned to engage the intermediate member of the retaining clip when the engaging members engage the securing members of the retaining clip and have moved the securing members relative to the intermediate member by a selected distance.

13. The tool of claim 11 wherein the first and second engaging members are elongated and extend away from the retaining clip when the engaging portions of the first and second engaging members engage the retaining clip, the first engaging member having a first handle portion spaced apart from the engaging portion thereof and the second engaging member having a second handle portion spaced apart from the engaging portion thereof, the first and second handle portions being adapted to be engaged by a user's hand.

* * * * *

UNITED STATES PATENT AND TRADEMARK OFFICE
CERTIFICATE OF CORRECTION

PATENT NO. : 6,178,611 B1
DATED : January 30, 2001
INVENTOR(S) : Boe

It is certified that error appears in the above-identified patent and that said Letters Patent is hereby corrected as shown below:

<u>Title page,</u>
Item [73], Assignee should be -- Micron Technology, Inc., Boise, ID --;

<u>Column 3,</u>
Line 22, "referred" should be -- preferred --;
Line 44, "sructure" should be -- structure --;

<u>Column 4,</u>
Line 33, "mction" should be -- motion --;

<u>Column 5,</u>
Line 15, "tool 1" should be -- tool 10 --;
Line 52, insert -- the -- between "that" and "tool";

<u>Column 7,</u>
Line 17, "he" should be -- the --;
Line 63, insert -- and -- before "disengage";

<u>Column 8,</u>
Line 16, "in" should be -- pin --;
Line 22, "explode" should be -- exploded --;
Line 27, insert -- end -- between "one" and "fixedly";
Line 30, "n" should be -- in --;

Signed and Sealed this

Twenty-sixth Day of November, 2002

Attest:

JAMES E. ROGAN
*Attesting Officer*          *Director of the United States Patent and Trademark Office*